United States Patent [19]

Inbar

[11] Patent Number: 5,696,445
[45] Date of Patent: Dec. 9, 1997

[54] METHOD AND APPARATUS FOR TESTING THE RESISTIVE PROPERTIES OF MAGNETO RESISTIVE MATERIALS USING A TIME VARIABLE MAGNETIC FIELD

[75] Inventor: Michael Inbar, Santa Barbara, Calif.

[73] Assignee: Phase Metrics, San Diego, Calif.

[21] Appl. No.: 312,307

[22] Filed: Sep. 26, 1994

[51] Int. Cl.[6] ............................ G01R 35/12; G01N 27/72
[52] U.S. Cl. .......................... 324/228; 324/210; 324/252; 324/235
[58] Field of Search ........................ 324/202, 225, 324/228, 207.12, 207.14–207.21, 601, 691, 210, 252, 201, 234–236, 239–243; 338/32 R; 365/8, 158; 327/510, 530–533; 360/113

[56] References Cited

U.S. PATENT DOCUMENTS

| | | | |
|---|---|---|---|
| 3,826,976 | 7/1974 | Winston et al. | 324/202 X |
| 3,956,693 | 5/1976 | Zatranen et al. | 324/207.16 X |
| 3,993,946 | 11/1976 | Makino . | |
| 4,038,597 | 7/1977 | Gorter et al. . | |
| 4,048,557 | 9/1977 | Chen | 324/210 |
| 4,119,911 | 10/1978 | Johnson, Jr. . | |
| 4,142,218 | 2/1979 | Gorter | 338/32 R |
| 4,190,799 | 2/1980 | Miller et al. | 324/228 X |
| 4,280,158 | 7/1981 | De Niet | 360/113 |
| 4,488,112 | 12/1984 | Thompson et al. | 324/202 |
| 4,491,794 | 1/1985 | Daley et al. | 324/202 X |
| 4,514,687 | 4/1985 | Van Husen | 324/202 X |
| 4,703,378 | 10/1987 | Imakoshi et al. | 360/113 |
| 4,716,306 | 12/1987 | Sato et al. . | |
| 4,868,909 | 9/1989 | Löwel . | |
| 4,875,010 | 10/1989 | Yokosawa et al. . | |
| 5,065,094 | 11/1991 | Mowry | 324/207.21 |
| 5,206,588 | 4/1993 | Thorn . | |
| 5,287,056 | 2/1994 | Jackson et al. . | |
| 5,343,145 | 8/1994 | Wellman et al. | 324/228 X |
| 5,483,162 | 1/1996 | Ushikoshi et al. | 338/38 R |

FOREIGN PATENT DOCUMENTS

3442278  5/1986  Germany .

OTHER PUBLICATIONS

Kryder, M. H., Ahn, K. Y., Mazzeo, N. J., Schwarzl, S., and Kane, S. M., "Magnetic Properties and Domain Structures in Narrow NiFe Stripes", IEEE Transactions on Magnetics, vol. MAG-16, No. 1, Jan., 1980.

Barnard, R.D., "Magnetoresistance Measurement in Magnetic Alloys in Ultralow Magnetic Fields", *J. Appl. Phys.*, vol. 73, No. 10, Pt. IIB, May 1993, pp. 6846–6848.

Kitada, M. and Nakatani, R., "Magnetoresistive Response of Giant-Magnetoresistive NiFe/Cu Multilayer Elements", *Journal of Magnetism and Magnetic Materials*, vol. 127, Nos. 1/2, Oct. 1993, pp. 224–228.

*Primary Examiner*—Sandra L. O'Shea
*Assistant Examiner*—Jay M. Patidar
*Attorney, Agent, or Firm*—Dennis H. Epperson

[57] ABSTRACT

A tester for measuring the resistance of magnetoresistive heads as a function of the magnetic field applied to the heads. The tester applies a time varying magnetic field to the magnetoresistive head to be tested and filters the resulting time varying (AC) voltage signal indicative of the resistance of the head with a capacitor to remove the DC component of the signal. The AC component of the signal is then amplified, digitized, and analyzed to obtain the resistance properties of the magnetoresistive head.

27 Claims, 5 Drawing Sheets

RESISTANCE (Signal 80)
MAGNETIC FIELD (Signal 82)

DELTA R (OHMS)

METHOD AND APPARATUS FOR TESTING THE RESISTIVE PROPERTIES OF MAGNETO RESISTIVE MATERIALS USING A TIME VARIABLE MAGNETIC FIELD

FIELD OF THE INVENTION

The present invention relates to devices which test the resistive properties of magnetoresistive materials.

BACKGROUND OF THE INVENTION

Magnetoresistive heads are devices suitable for reading magnetically-recorded information, for example, information stored on a magnetic tape or disk. Magnetoresistive heads contain a material which has a resistance that varies as a function of the strength of the magnetic field applied to it. For such materials, if the resistance of the head in the absence of a magnetic field is R, the resistance of the material in the presence of a magnetic field of strength B will be some lower value R–r. Generally, r, the function which expresses the dependence of the resistance of the material on the applied magnetic field, is a symmetric nonlinear function with an absolute maximum at the point B=0.

Before a magnetoresistive head is employed to read magnetically-recorded information on a disk drive, a detailed knowledge of its resistive properties as a function of the applied magnetic field must be obtained. Prior art magneto resistance testers have subjected the magneto resistive head to a constant magnetic field generated by passing a precisely-controlled current through an appropriate winding. After the current generating the magnetic field has been allowed to stabilize, the resistance of the head is carefully measured by a balancing bridge. After a satisfactory resistance measurement has been obtained, the value of the magnetic field is changed by changing the value of the current going to the winding.

This prior-art method for ascertaining the resistance behavior of magnetoresistive heads suffers from several disadvantages. The first of these is that it requires an expensive power supply. The power supply must be capable of supplying a very accurate DC current to the windings of the electromagnet used to create the reference magnetic field. Such power supplies are difficult to construct and expensive to purchase. To obtain a resistance measurement which is accurate to 0.1%, the resolution of the current supply must typically be on the order of 10 mA.

A second disadvantage suffered by prior-art resistance testers is that the device measuring the resistance of the head as a function of the varying reference magnetic field must also be extremely accurate and must possess an extraordinary dynamic range. A typical resistance value of the magnetoresistive element when no magnetic field is present is approximately 50 ohms. The maximum change in resistance resulting from application of the magnetic field, however, is only approximately 30 milliohms. Thus, the measuring resistance bridge requires a resolution of better than $30 \times 10^{-3}$ Ohm/50 Ohm=$6 \times 10^{-4}$. Consequently, in order to resolve the change in resistance to within 1%, the resolution of the bridge which measures the resistance of the element must have a resolution better than $6 \times 10^{-4}/100 = 6 \times 10^{-6}$. Furthermore, the bridge must possess this resolution over a great dynamic range, since the no-field or background resistance R of the head is several orders of magnitude greater than the maximum value of the component r of the resistance which varies as a function of the applied magnetic field and the no-field resistance R of the individual heads varies considerably. Finally, the resistance measurements require a considerable time to be taken, during which the current supplied to the windings of the magnet is allowed to stabilize and the resistance bridge is balanced.

Consequently, prior-art devices and methods for measuring magneto resistance by creating a precisely controlled magnetic field around the magneto resister and measuring the resistance of the magneto resister with a balancing bridge are expensive to construct, time-consuming to operate, and ill-suited for use in process control testing on the production line for magnetoresistive disk drive reading heads.

Another prior art discussion relating to the measurement of magnetoresistance is found in a paper entitled "MAGNETIC PROPERTIES AND DOMAIN STRUCTURES IN NARROW NIFE STRIPES", IEEE Transactions on Magnetics, Vol. MAG-16, No. 1, pg. 99–103 (January 1980). This paper contains two figures which represent the coercivity and magnetoresistance in thin NiFe stripes which were measured from the stripes' longitudinal and transverse magnetoresistance characteristics, respectively. This article briefly mentions applying a 60 Hz magnetic field to the stripe and observing the total variation in resistance on an oscilloscope. The magnetoresistance as a percentage of the total resistance, $\Delta\rho/\rho$, was determined from the ratio of the peak resistance in this oscilloscope trace to the total dc resistance of the stripe. This paper does not indicate how the observed signal is processed, by what technique the magnetic field is applied, or exactly how the graphed output signal is obtained. Thus, this paper does not disclose a device or method for measuring magnetoresistance as a function of applied magnetic field having a resolution for the change in resistance due to the magnetic field even approaching 1%.

Consequently, a need exists for a device which can quickly, precisely, and inexpensively ascertain the resistance properties of a magnetoresistive device as a function of the strength of the magnetic field surrounding the device, particularly a magnetoresistive device to be used as a head on a computer disk drive.

SUMMARY OF THE INVENTION

In accordance with the present invention, an apparatus for characterizing the resistive properties of a magnetoresistive element in response to a changing magnetic field is provided. The device includes an electromagnet located adjacent to the magnetoresistive element to be tested. A time-varying voltage is applied to the electromagnet, thereby generating a time-varying magnetic field. A filter connected to the magnetoresistive element substantially removes the DC (time-invariant) component of the measured signal indicative of the resistance value. The output from the filter is sent to a signal processor. The signal processor analyzes the signal from the magnetoresistive element as a function of the time-varying magnetic field and determines the resistance characteristics of the magnetoresistive element as a function of the strength of the applied magnetic field.

According to another aspect of the present invention, the testing apparatus further includes a source of DC bias current which is directed through the magnetoresistive element. The bias current may be chosen to have a value characteristic of its value in intended actual operation of the magnetoresistive element in a disk drive.

According to another aspect of the present invention, the testing apparatus further includes an amplifier connected to the output from the filter. The amplifier amplifies the time-varying component of the signal passed by the filter and indicative of the resistance of the magnetoresistive element under investigation for analysis by the signal processor.

According to yet another aspect of the present invention, the testing apparatus further includes an analog-to-digital converter connected to the output of the amplifier. The analog-to-digital converter digitizes the amplified time-varying signal so that it may be analyzed by familiar digital signal processing (DSP) techniques.

According to still another aspect of the present invention, the time-varying voltage applied to the electromagnet may be 60 Hz power line voltage.

In accordance with another aspect of the present invention, the electromagnet can be chosen to be a coil magnet. According to still another aspect of the present invention, the signal processor is used to measure the rate of change of the resistance of the magnetoresistive element as a function of the magnetic field applied to the magnetoresistive element.

According to still another aspect of the present invention, the testing apparatus may include a controller such as a transformer capable of varying the amplitude of the time-varying voltage applied to the electromagnet.

In another aspect of the present invention, the filter is a capacitor.

In accordance with the present invention, a method for measuring the resistance of a magnetoresistive device as a function of the applied magnetic field is also provided. The method includes the step of applying a periodically-varying magnetic field to the magnetoresistive device, and providing a filter at a terminal of the magnetoresistive device. A voltage signal proportional to the resistance of the magnetoresistive device is obtained at the filter, which removes the time-invariant (DC) component of the voltage signal. Finally, the resulting time-varying voltage signal is analyzed to determine the resistance of the magnetoresistive element as a function of the strength of the magnetic field applied to the element.

According to another aspect of the method of the present invention, a DC bias current is applied to one terminal of the magnetoresistive device.

According to another aspect of the method of the present invention, the periodically-varying magnetic field applied to the magnetoresistive device under investigation may be sampled to calibrate the resistance measurements obtained by the device of the present invention. Additionally, the step of filtering the signal may further include filtering with a capacitive filter.

The present invention provides a simple, inexpensive, and extremely accurate device for ascertaining the resistance properties of a magnetoresistive head as a function of the strength of an applied magnetic field. By applying a periodically-varying magnetic field to the head and employing a filtering capacitor, the background resistance R of the head is effectively removed and the varying resistance r, which is the quantity of interest, may be directly examined, amplified, and studied, thereby allowing all of the magnetoresistive properties of interest to be accurately and quickly determined. The present invention therefore eliminates the difficulties present in prior-art resistance testers, namely the need for extremely accurate resistance measurements over a large dynamic range and the requirement for a very accurate and expensive controllable DC current supply to drive the electromagnet. The measurement of magnetoresistive properties with the present invention is not only much faster than prior techniques, but is also orders of magnitude more sensitive than prior art techniques.

These and other characteristics of the present invention will become apparent through reference to the following detailed description of the preferred embodiments and accompanying drawings.

DETAILED DESCRIPTION OF THE PREFERRED EMBODIMENTS

Figure 1:
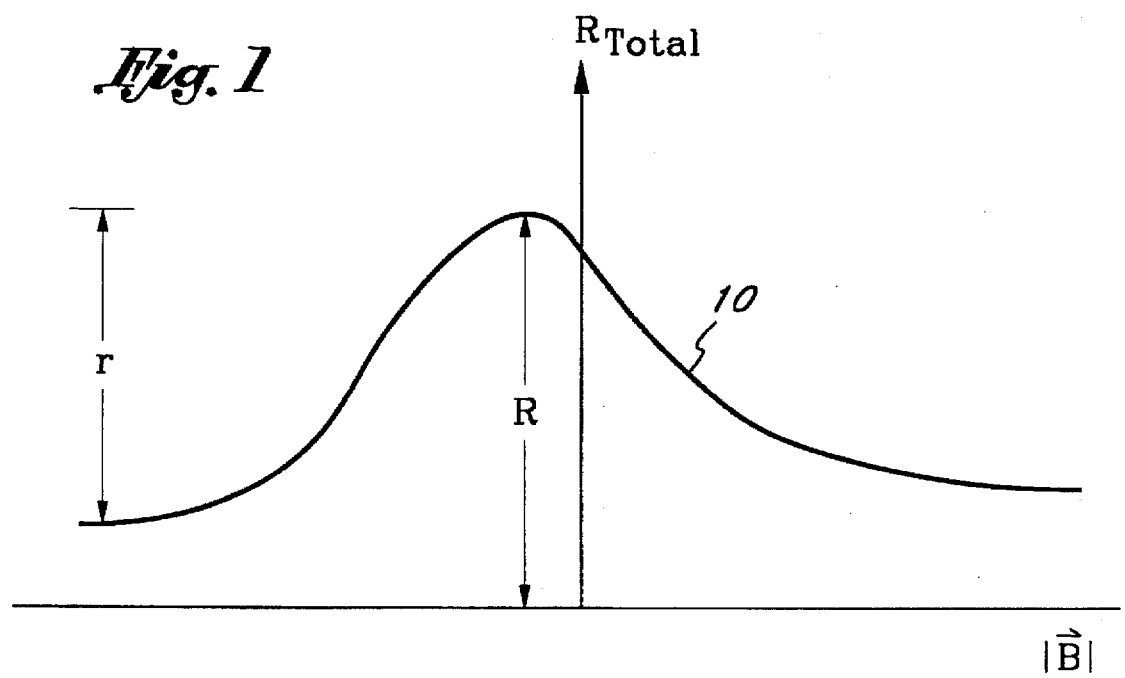
FIG. 1 is a graph illustrating the resistance properties of a typical magnetoresistive device.

The resistive properties of a typical magnetoresistive device tested by the apparatus of the present invention are illustrated in FIG. 1, which is an idealized graph of the resistance $R_{total}$ of the device (on the vertical axis) as a function of the strength of the applied magnetic field B (on the horizontal axis). From FIG. 1, it can be seen that the resistance curve 10 includes a constant component R (defined as the maximum resistance of the device at the point about which the resistance curve 10 is symmetric) and a component r which varies as a function of the applied magnetic field. The total resistance, then, is $R_{total}=R-r(B)$, because the resistance $R_{total}$ decreases around the point where R is measured as a function of the applied magnetic field. While the components R and r are illustrated as having approximately equal magnitudes in FIG. 1 for ease of visualization, it should be understood that R actually has a much greater value than r. The resistance R of a typical element when no magnetic field is present is approximately 20–50 ohms, while the maximum typical reduction in resistance r as a result of varying the magnetic field is only about 30 milliohms. Consequently, any device which measures the variance in the resistance r as a function of B must measure a very small change in a relatively large quantity.

It is apparent from FIG. 1 that the resistance curve 10 is not symmetrical about the zero magnetic field line but is substantially symmetrical about a non-zero value of the magnetic field B. The specific value of the magnetic field about which the curve 10 is substantially symmetric may be controlled by controlling the magnitude of the DC bias current passing through the magnetoresistive device. In the theoretical limit where the bias current through the magnetoresistive device goes to zero, the curve 10 would tend to be symmetric about the zero magnetic field line. The resistance curve 10 illustrates data representative of a magnetoresistive device into which a DC bias current typical of that used for a recording head is being passed.

Figure 2:
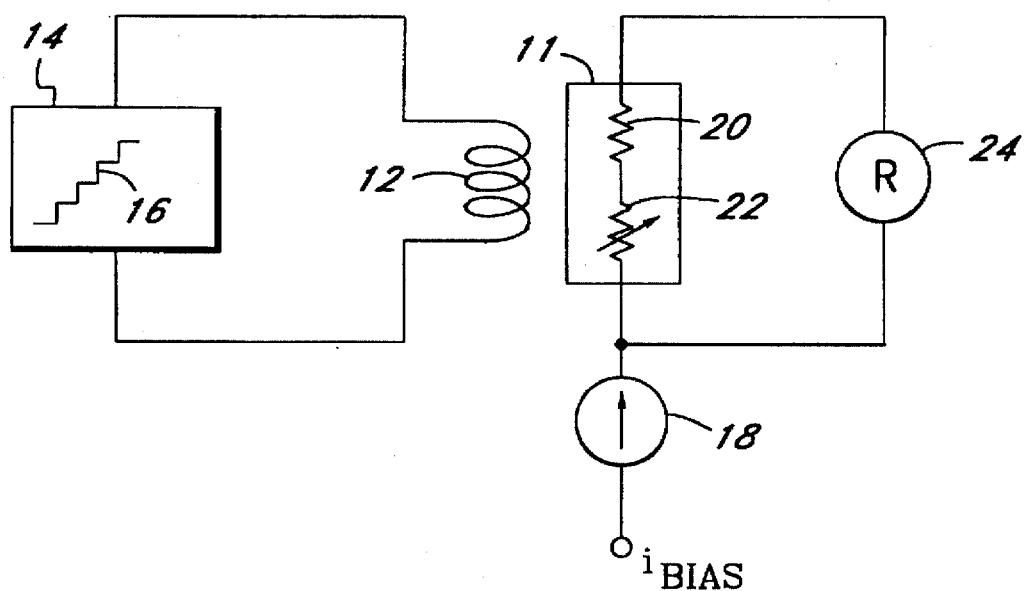
FIG. 2 is a schematic diagram illustrating a typical prior-art resistance tester for measuring the resistance of a magnetoresistive device as a function of the strength of the magnetic field surrounding the device.

A typical prior-art tester for measuring the resistive properties of a magnetoresistive element 11 as a function of applied magnetic field B is illustrated in FIG. 2. The prior-art tester includes an electromagnet 12, to which a DC current is applied by a controllable power supply 14. The power supply 14 supplies current to the magnet 12 in a stepwise fashion, as shown in the graph 16. Each step changes the value of the applied magnetic field B, which is proportional to the number of windings in the electromagnet and which may be calculated by familiar techniques. The power supply 14 must be very accurately controllable and typically must have a resolution of approximately ±10 mA over a range of ±15 A to achieve a resistance measurement accurate to 0.1%. A considerable dynamic range is thus required of the power supply, which is therefore relatively expensive.

The magnetoresistive element 11 is placed in the magnetic field created by the electromagnet 12 and a bias current 18 is applied to it. The bias current 18 ($i_{bias}$) is usually given a value typical of that anticipated during use of the head in a disk drive or other data storage medium. The magnetoresistive element 11 is shown as two separate resistances 20 and 22. Resistance 20 represents the no magnetic field or background resistance R which does not vary as a function of B, while variable resistance 22 represents the much smaller resistance r which varies as a function of the applied magnetic field B and which is the quantity of interest for most applications of magnetoresistive heads. As illustrated in FIG. 1, values for r are taken to be positive, so that the total resistance of the magnetoresistive element 11 is given by $R_{total}=R-r(B)$.

The device illustrated in FIG. 2 includes a resistance measuring device 24 which measures $R_{total}$ as a function of the magnetic field B applied by the magnet 12 at each value of the current provided to the magnet 12 by the power supply 14. The resistance measuring device 24 is usually chosen to be a resistance bridge which is balanced to obtain the value of $R_{total}$ each time the magnetic field B is changed by the power supply 14. The resistance tester 24 must provide a very accurate measurement of $R_{total}$ over a very large range of resistances. Consequently, it must possess a very large dynamic range both because the quantity r(B) of interest is an extremely small fraction of the total measured resistance $R_{total}$ and because the resistance R may vary greatly from one magnetoresistive head 11 to another. The resolution typically required of the resistance meter 24 for a commercially-acceptable measurement accuracy is as great as $6 \times 10^{-6}$ over a range of resistances from approximately 10 ohms to approximately 100 ohms. The resistance meter 24 must therefore be constructed very precisely, and if a bridge is used to measure $R_{total}$, it must be carefully balanced each time the current through the magnet 12 is changed by the power supply 14.

A graph characterizing the resistive behavior of the head 11 which is similar to that shown in FIG. 1 is obtained for the element 11 by changing the value of the current supplied to the magnet 12 through the power supply 14 in a stepwise fashion. For each resulting value of B, the resistance bridge 24 is then balanced to obtain a value for $R_{total}$. This process must be repeated as many as several tens of times to obtain the graph illustrated in FIG. 1 to the desired degree of resolution. Consequently, the most common prior-art method of characterizing the resistive properties of the head 11 is very time-consuming and therefore ill-suited to testing magnetoresistive heads in the setting of mass production.

Figure 3:
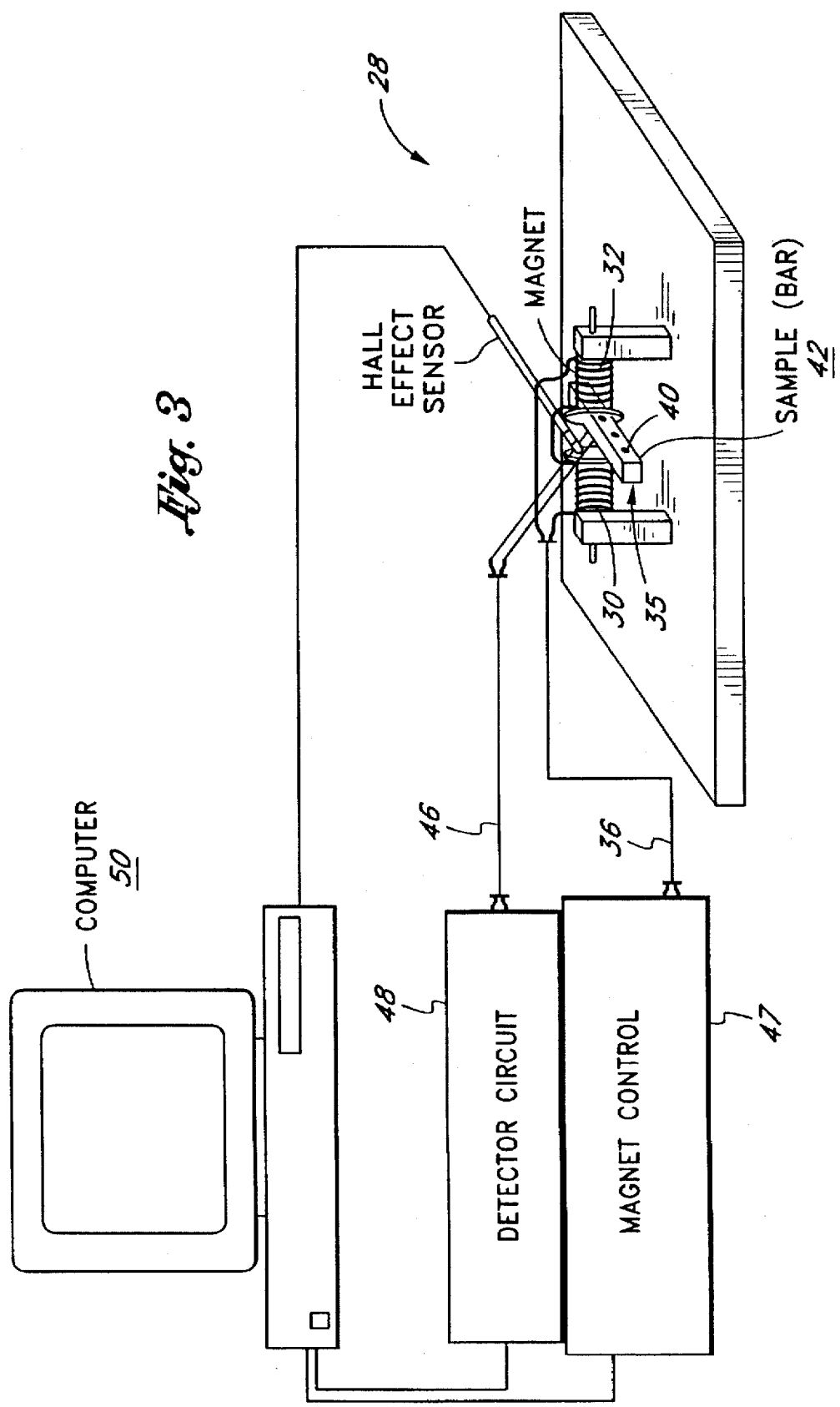
FIG. 3 is a perspective view of the resistance measurement apparatus of the present invention.

The testing apparatus of the present invention is illustrated in FIG. 3 at 28. It includes electromagnets 30 and 32 connected to a magnet control circuit 47 by a cable 36. The electromagnets 30 and 32 are preferably coils with a known number of windings so that the resulting magnetic field in the space 35 between them can be easily calculated. The space 35 separating the coils 30 and 32 is selected to be narrow in relation to the diameter of each of the electromagnets 30 and 32, thereby maximizing the magnetic field strength in the space 35 for a given current and ensuring that the magnetic field in that region is substantially uniform. The cores of each electromagnet 30 and 32 preferably do not include any magnetic materials. This is done to avoid or minimize hysteresis and residual magnetization effects. The magnets are designed by well-known techniques to generate a field which is homogeneous around the head to be tested. The magnetic field applied to the head is directly proportional to the current applied to the electromagnet coils 30 and 32. To reach fields up to 600 Oersted, the coils are mounted as close together as possible. Helmholtz coils could be used but are not generally necessary since field uniformity over a large volume is not critical for applications involving magnetoresistive heads since the size of the head is so small. Each magnetoresistive head 40 to be tested is typically one of many such heads manufactured on a wafer which is subsequently cut into bars. Thus, each bar 42 is a linear array of multiple heads 40. The bar 42 is held between the magnets 30 and 32 by a bar holder mechanism 44 (see FIG. 4). As each head 40 is tested, the holder 44 is used to move the bar 42 so that another head 40 on the bar 42 may be tested. Each head 40 is connected to testing circuitry 48 by a wire pair 46 when it is being tested. The magnet control circuit 47 and the testing circuitry 48 are connected to a computer 50 which controls the acquisition of data, stores the data, analyzes the data and outputs the results of the test.

Figure 4:
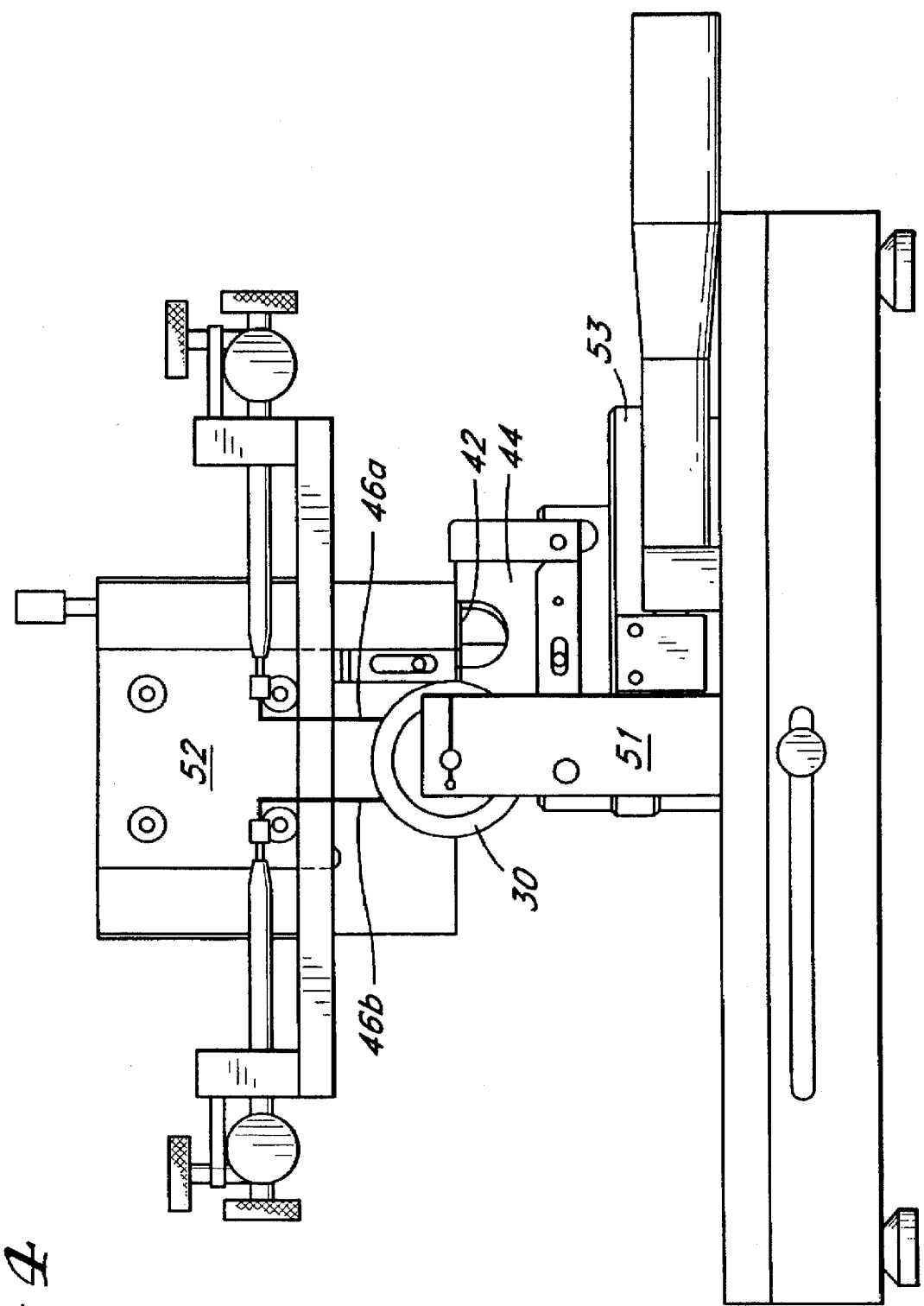
FIG. 4 is a side view of the mechanical apparatus which holds the test bars, probes and magnet coils of the present invention illustrating the operation of the device for making fast, repetitive measurements.

Holding a bar 42 requires a fixture that fits between the electromagnet coils 30 and 32, provides solid support and is easy to use. Furthermore, once the bar 42 is mounted to the fixture, indexing from one head 40 to the next head 40 on the bar 42 should be simple and quick. Contact to the pads on the bar is preferably fast, repeatable and reliable. The present invention meets these requirements as shown in FIG. 4, first by mounting the electromagnet coils 30 and 32 on a stage 51 that allows the coils to be moved out the way while measurement probes 46a and 46b make contact to the connection pads on the head 40 being measured. Once contact between the probes 46 and the connection pads is made, the magnet coils 30 and 32 are moved back into place, and measurement of the first head on the bar is made. The measurement probes 46 are mounted on a translation stage 52 that allows them to be raised and lowered so that after a measurement on one head is made, the bar 42 can be indexed to the next head. The bar 42 is positioned using a micrometer driven stage 53. Once in position for the next measurement, the probes 46 are lowered to make contact with the contact pads of the next head to be measured, and the measurement proceeds. All the mechanics for this process may be motor-driven thus enabling automatic operation.

Figure 5:
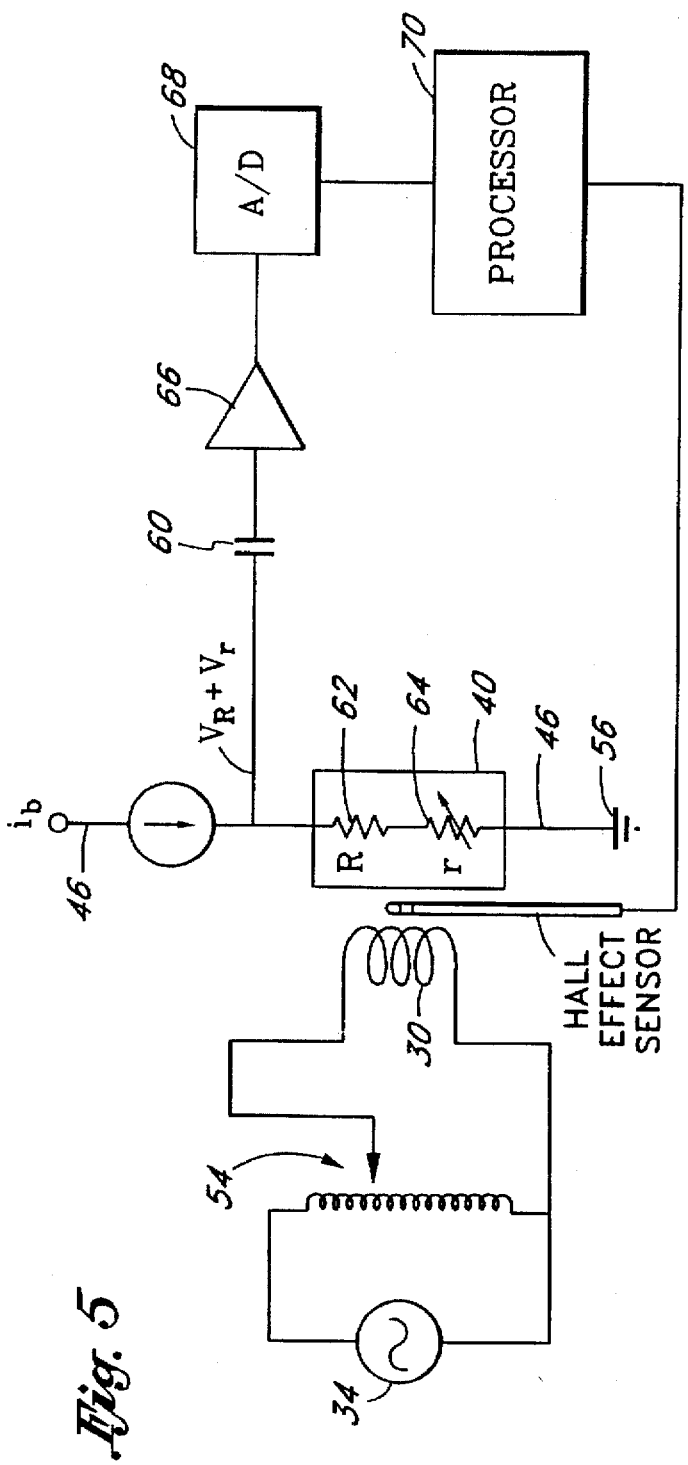
FIG. 5 is a schematic diagram illustrating the operation of the resistance measurement apparatus of FIG. 3.

A simplified schematic diagram of the testing apparatus of the present invention is illustrated in FIG. 5. Referring to FIGS. 3 and 5, the AC power supply 34 supplies an AC current to each of the electromagnets 30 and 32. The amplitude of the current is controlled by a controller 54 which is preferably a variable transformer. The power supply 34 preferably supplies power line 60 Hz current to the magnets 30 and 32. Power line current is preferred because its frequency and phase are usually extremely stable and it is easily obtained from electrical outlets. The magnetoresistive head 40 to be analyzed by the tester is placed in the gap 35 between the magnets 30 and 32 and a bias current $i_b$ is passed through the head through the wires 46. The wires 46 are connected to ground at 56. The application of the bias current $i_b$ and the magnetic field B to the head 40 cause a time-varying voltage V proportional to the head resistance $R_{total}$ to be generated by the head 40 and transmitted through the wires 46. The voltage V from the head 40 varies in response to the applied magnetic field B, and the resistance of the magnetoresistive head 40 may be determined from measuring V and $i_b$ by applying Ohm's law.

The tester circuitry advantageously includes a filtering capacitor 60 located at the input of the tester from the wires 46. The filtering capacitor 60 removes the DC component of V (denoted by $V_R$) which is proportional to the constant no field resistance R (illustrated at 62) and passes the time-varying component of V (denoted by $V_r$) which is proportional to the varying resistance r(B) (illustrated as variable resistor 64) which is the quantity of interest. $V_r$ and $V_R$ satisfy the relation $V=V_r+V_R$. The time-varying voltage $V_r$ has a frequency which is equal to twice the frequency of the AC current used to drive the magnets 30 and 32. The time-invariant component $V_R$ of V is advantageously removed by the capacitor 60. An amplifier 66 amplifies the signal $V_r$ proportional to r(B), after which the signal $V_r$ is digitized by a 12-bit analog-to-digital (A/D) converter 68. The resulting digitized signal indicative of $V_r$ is passed to a signal processor 70 where it is analyzed to determine the resistance parameters of the head 40 which are of interest to the user. The signal processor 70 preferably includes a field-programmable gate array (FPGA) which is programmed in a fashion which is well known to those skilled in the art to include the logic required to extract and process the signals $V_r$ and B. The output from the signal processor 70 is connected to a computer (not shown) which further processes and displays the data.

The magnetic field B applied to each head 40 is measured between the electromagnets 30 and 32 by a Hall effect sensor. The time-varying values of B observed by the Hall effect sensor are fed to the signal processor 70 so that the magneto resistance r can be determined as a function of the magnetic field B, i.e., r(B).

In operating the tester 28, a bar 42 containing a plurality of magnetoresistive heads 40 or head gimbal assembly (HGA) (not shown) is placed between the electromagnets 30 and 32. The wires 46 connected to the head 40 are secured to the testing circuitry of the tester 28 and the bias current $i_b$ is provided by the testing circuitry to the head 40 at a strength typical of that used during commercial operation of the head 40. The power supply 34 is then energized, generating the time-varying magnetic field B at the head 40. The strength of the magnetic field B is controlled by the controller 54. The voltage $V_r$, which varies in response to the changes in the resistance of the head 40 as a function of the applied magnetic field, is obtained at the capacitor 60 by the testing circuitry, amplified by the amplifier 66, and digitized by the A/D converter 68. The digitized signal $V_r$ is passed to the signal processor 70 with the measured values of B, where it is analyzed as described below.

Figure 5A:
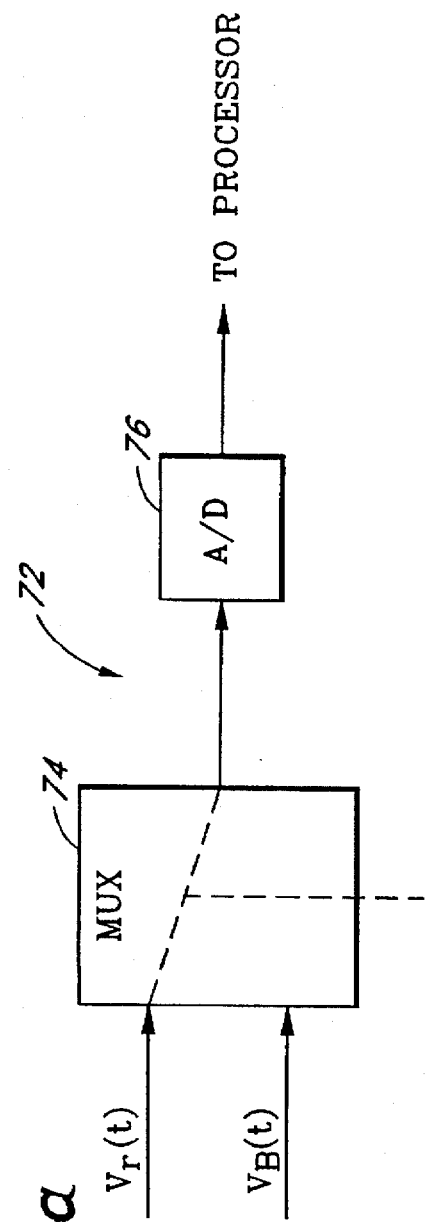
FIG. 5a is a schematic diagram illustrating a multiplexer having 2 inputs connected to an A/D converter for acquiring the resistance and magnetic field signals.

Shown in FIG. 5a is a circuit 72 which includes a multiplexer 74 having 2 inputs. The output of the multiplexer is connected to an A/D converter 76. This circuit enables the voltage signal $V_r$, which represents the changes in the resistance of the head 40 as a function of the applied magnetic field B, and $V_B$, which is a voltage signal which represents the strength of the magnetic field B, to be digitized by the single A/D converter 76. As stated previously, the signal $V_B$ representative of the strength of the magnetic field B, is the output of a magnetic field strength detector such as a Hall probe. The multiplexer 74 alternately selects the signals $V_r(t)$ and $V_B(t)$ and directs them to the input of the A/D converter 76. This is advantageous in that it reduces the complexity and cost of the system. However, care must be taken to ensure that accuracy is not lost. In other words, it is important that the recorded values of the signals $V_r(t_1)$ and $V_B(t_1)$ be for the same time $t_1$. They can be measured at exactly the same time only if each signal has its own A/D converter. However, as shown below, if the time interval between the measurement of $V_r(t_1)$ and $V_B(t_1)$ is about 1 microsecond or less and a 12 bit A/D converter is used, the resulting accuracy is equivalent to using two separate A/D converters. Consider the function $$y(t)=\sin(\omega t)$$

where $$\omega=2\pi(60)$$

for a 60 Hz sine wave. The derivative of the function y(t), $$\frac{d}{dt}y(t)=\omega\cos(\omega t)$$

has a local maximum at time t=0. The value of the derivative at this point is $\omega$. Thus, at time $t=\Delta t$, $$y(\Delta t)=\omega(\Delta t).$$

For $\Delta t=1$ microsecond, $y(10^{-6})=377\times10^{-6}$. Thus, the maximum sampling error due to a 1 microsecond time shift is $$\log_2\left(\frac{1}{377\times10^{-6}}\right)=ld\left(\frac{1}{377\times10^{-6}}\right)=11.3 \text{ bits}$$

which is smaller than the resolution of a 12 bit A/D converter (11 bits+sign). In other words, the maximum difference between the values of $V_B(t_1)$ and $V_B(t_1+\Delta t)$ where $\Delta t=1$ microsecond or less, is less than the resolution of a 12 bit A/D converter. Thus, as measured by a 12 bit A/D converter, $V_B(t_1)=V_B(t_1+\Delta t)$ where $\Delta t=1$ microsecond or less.

Hence, the output of the A/D converter 76 is a time series of ordered pairs (resistance,magnetic field) from which the variation of resistance as a function of the magnetic field can be constructed. Since the magnetic field is measured directly with a Hall probe, it is known independently of the current generating the field. Thus, any disturbances which may occur in the generation of the field, such as current or power fluctuations, will not affect the accuracy of the measurement.

Figure 6:
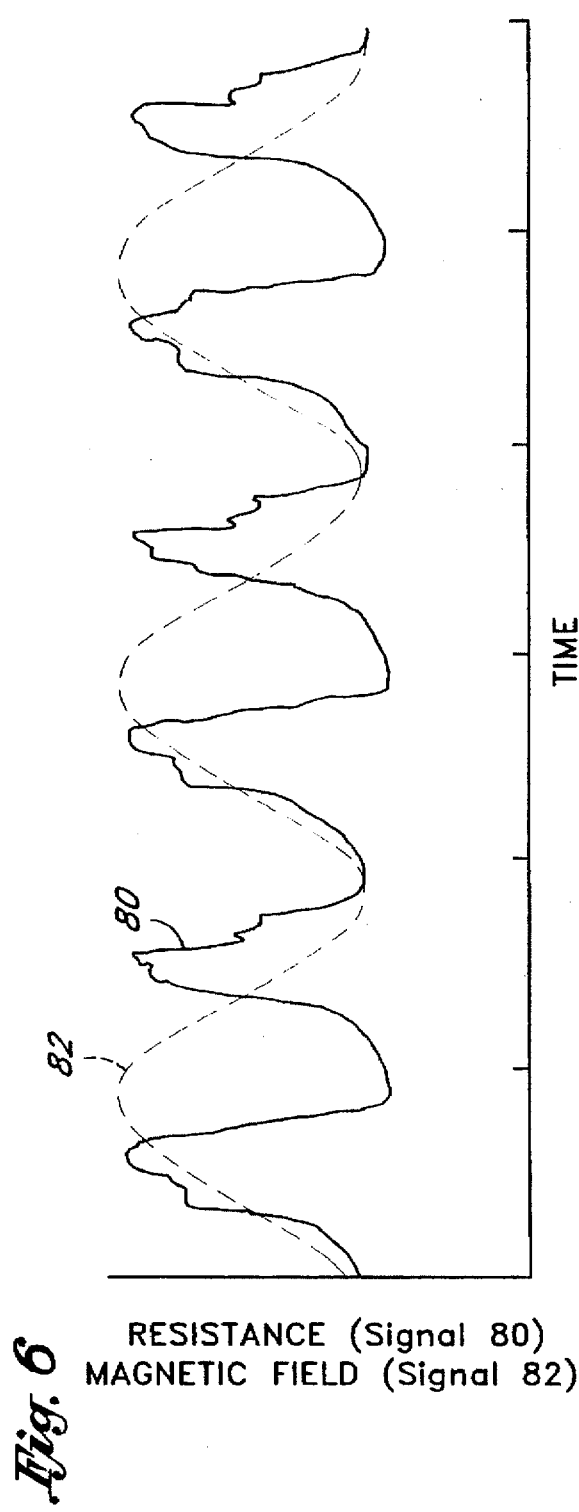
FIG. 6 is a graph illustrating a typical raw resistance measurement as a function of applied magnetic field generated by the testing apparatus illustrated in FIGS. 3 and 5.

A computer plot of the resistance r(B) as a function of the time-varying magnetic field B derived by the signal processor 70 is illustrated in FIG. 6. In FIG. 6, the time-varying component of the resistance r(B) is plotted at 80 as a function of the magnetic field graphed at 82 applied to the magnetoresistive head 40. The plot of FIG. 6 is generated as follows: The computer receives the raw data, which are digitized time series representative of the values of r(B) and B, and initially assigns them to input arrays. The arrays include a reference number of values, typically 10 frames of 400 values each, for a total of 4000 measurement points. The reference magnetic field B is then time-shifted by familiar means so that it begins with a zero-crossing and positive slope for convenience.

The computer then calculates the maximum numerical values of the head resistance r(B) and other parameters of interest listed below for each cycle contained in the input arrays. The tester of the present invention is capable of computing the maximum resistance $R_{max}$ of the head 40, as well as the range of resistances present in the head, the resistance of the head at B=0, the linearized slope of the resistance function r(B) at B=0 (termed the sensitivity), the maximum value of the slope of r(B) (termed the maximum sensitivity),and the full-width at half maximum of the resistance value. These values, which are calculated by conventional techniques from the processed input time series, are written to a final output file, which includes the processed time series and which is plotted by conventional means to make the graph illustrated in FIG. 6. Because the resistance r(B) is a periodic function, its Fourier transform may also be calculated by the computer to further aid in the analysis of the data. Conventional curve-fitting algorithms may advantageously be used to fit polynomial or other functions to the observed date for further analysis.

Figure 7:
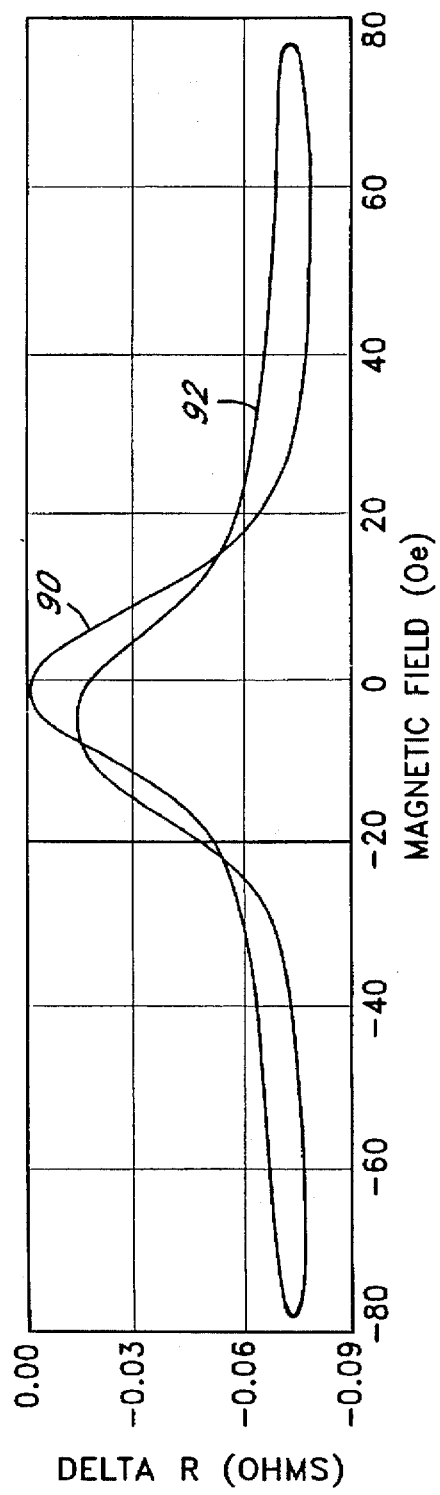
FIG. 7 is a graph generated by the testing apparatus illustrated in FIGS. 3 and 5 which shows the resistance of a magnetoresistive device under investigation and which includes a measurement of the hysteresis present in the magnetoresistive device.

The tester of the present invention may also be used to provide useful information about the hysteresis characteristics of the magnetoresistive head 40 being tested. Hysteresis refers to the failure of the resistance values to return to their original values on subsequent applications of the same magnetic field to the head 40. A graph illustrating hysteresis in a magnetoresistive head 40 is illustrated in FIG. 7. The resistance r(B) as a function of the applied magnetic field B is seen to differ in the same head between the first sampling illustrated by the graph 90 and the second sampling illustrated by the graph 92. A measure of the hysteresis of a magnetoresistive head is an important parameter in the characterization of the response of the head to a changing magnetic field.

The accuracy of the resistance measurements of r(B) is determined by the gain of the amplifier, which is preferably calibrated by injecting a reference signal at the signal frequency and measuring the resulting head voltage. Once calibrated, the limitation on the accuracy of the system is set by uncertainties in the voltage measurement and the head current, and the accuracy of the AC resistance measurement of r(B) is better than 15 micro ohm after use of the calibration process described above.

Because the tester of the present invention advantageously suppresses the DC or time-invariant component R of the resistance of the head, the measurement of the resistance r(B) does not require a dynamic range as great as that of prior-art testers. The gain in measurement resolution as a result of suppressing the DC component R is approximately a factor of 10,000 over the prior-art tester described above. An additional benefit provided by the present invention is that the resistance measurements may be made very rapidly, since the technique of the present invention allows more than 4000 samples of r at varying values of B to be taken every second. This feature of the present invention eliminates the time-consuming balancing operation required in prior-art testers, and the availability of so many measurements in such a short time produces measurements with a precision of better than 1 micro ohm.

While the invention described below may be subject to many modifications which will be apparent to those skilled in the art, the apparatus and method of the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for determining the resistance of a magnetoresistive element in response to a changing magnetic field, comprising:

an electromagnet located adjacent said magnetoresistive element wherein a time-varying voltage is applied to said electromagnet, thereby generating a time-varying magnetic field having a time-varying magnetic field intensity;

a magnetic field intensity indicator which provides a time dependent magnetic field output signal, $V_B(t)$, which is proportional to said time-varying magnetic field intensity of said time-varying magnetic field at said magnetoresistive element;

a current source connected to said magnetoresistive element for passing an electrical current through said magnetoresistive element thereby producing a magnetoresistive element voltage signal across said magnetoresistive element which is characteristic of the resistance of said magnetoresistive element, wherein said magnetoresistive element voltage signal has a time-varying component, $V_r(t)$, produced by said time-varying magnetic field and a time-invariant component;

a filter connected to said magnetoresistive element, wherein said filter substantially blocks said time-invariant component of said magnetoresistive element voltage signal and transmits said time-varying component, $V_r(t)$, of said magnetoresistive element voltage signal;

a voltage sensor connected to said filter for detecting said time-varying component, $V_r(t)$, of said magnetoresistive element voltage signal; and a signal processor connected to said voltage sensor and said magnetic field intensity indicator, wherein said signal processor receives and analyzes said time-varying component of said magnetoresistive element voltage signal, $V_r(t)$, from said magnetoresistive element transmitted by said filter and said magnetic field output signal, $V_B(t)$, from said magnetic field intensity indicator which is proportional to said time-varying magnetic field intensity, and determines therefrom resistance of said magnetoresistive element as a function of said time-varying magnetic field intensity, wherein said signal processor further comprises:

a signal sampler which acquires a first time value of said magnetoresistive element voltage signal at a first time $t_1$ denoted as $V_r(t_1)$; a first time value of said magnetic field output signal at said first time $t_1$ denoted as $V_B(t_1)$; a second time value of said magnetoresistive element voltage signal at a second time $t_2$ denoted as $V_r(t_2)$; and a second time value of said magnetic field output signal at said second time $t_2$ denoted as $V_B(t_2)$, wherein said signal processor correlates said first time value of said magnetoresistive element voltage signal $V_r(t_1)$ with said first time value of said magnetic field output signal $V_B(t_1)$ and correlates said second time value of said magnetoresistive element voltage signal $V_r(t_2)$ with said second time value of said magnetic field output signal $V_B(t_2)$.

2. The apparatus of claim 1 wherein said current source further comprises a source of constant current directed through said magnetoresistive element.

3. The apparatus of claim 1, wherein said voltage sensor further comprises an amplifier having an input connected to said filter and an output connected to said signal processor.

4. The apparatus of claim 1 wherein said signal sampler further comprises:
   a first analog-to-digital converter (ADC) connected between said magnetic field intensity indicator and said signal processor for acquiring said first and second time values of said magnetic field output signal $V_B(t_1)$ and $V_B(t_2)$; and
   a second analog-to-digital converter (ADC) connected between said voltage sensor and said signal processor for acquiring said first and second time values of said magnetoresistive element voltage signal $V_r(t_1)$ and $V_r(t_2)$.

5. The apparatus of claim 1 wherein said time-varying voltage applied to said electromagnet is power line voltage.

6. The apparatus of claim 1 wherein said filter comprises a capacitor.

7. The apparatus of claim 1 wherein said magnetic field intensity indicator further comprises a Hall effect sensor.

8. An apparatus for characterizing the resistive properties of a magnetoresistive element in response to a varying magnetic field, said apparatus comprising:
   an electromagnet supplied with a time-varying voltage to create a periodically-varying magnetic field encompassing said magnetoresistive element, wherein said periodically-varying magnetic field encompassing said magnetoresistive element has a magnetic field intensity;
   a magnetic field intensity indicator which provides a time dependent magnetic field output signal, $V_B(t)$, which is proportional to said magnetic field intensity of said periodically-varying magnetic field encompassing said magnetoresistive element;
   a bias current source connected to said magnetoresistive element for passing an electrical current through said magnetoresistive element thereby producing a magnetoresistive element voltage signal across said magnetoresistive element which is characteristic of the resistance of said magnetoresistive element, wherein said magnetoresistive element voltage signal has a time-varying component, $V_r(t)$, produced by said periodically-varying magnetic field and a time-invariant component;
   a filter having an input terminal connected to said magnetoresistive element, said filter removing said time-invariant component of said magnetoresistive element voltage signal characteristic of the resistance of said magnetoresistive element and transmitting said time-varying component, $V_r(t)$, of said magnetoresistive element voltage signal characteristic of the resistance of said magnetoresistive element;
   a voltage sensor connected to an output terminal of said filter for detecting said time-varying component, $V_r(t)$, of said magnetoresistive element voltage signal; and
   a signal processor connected to said voltage sensor and said magnetic field intensity indicator for receiving said time-varying component of said magnetoresistive element voltage signal, $V_r(t)$, characteristic of the resistance of said magnetoresistive element and said magnetic field output signal, $V_B(t)$, from said magnetic field intensity indicator which is proportional to said magnetic field intensity of said time-varying magnetic field, wherein said signal processor further comprises:
   a first analog-to-digital converter (ADC) which acquires a first time value of said magnetoresistive element voltage signal $V_r(t)$ at a first time $t_1$ denoted as $V_r(t_1)$ and a second time value of said magnetoresistive element voltage signal $V_r(t)$ at a second time $t_2$ denoted as $V_r(t_2)$; and
   a second analog-to-digital converter (ADC) which acquires a first time value of said magnetic field output signal $V_B(t)$ at said first time $t_1$ denoted as $V_B(t_1)$ and a second time value of said magnetic field output signal $V_B(t)$ at said second time $t_2$ denoted as $V_B(t_2)$, wherein said signal processor correlates said first time value of said magnetoresistive element voltage signal $V_r(t_1)$ with said first time value of said magnetic field output signal $V_B(t_1)$ and correlates said second time value of said magnetoresistive element voltage signal $V_r(t_2)$ with said second time value of said magnetic field output signal $V_B(t_2)$ thereby determining the resistive characteristics of said magnetoresistive element as a function of said magnetic field intensity of said periodically-varying magnetic field.

9. The apparatus of claim 8, wherein said magnetic field intensity indicator further comprises a Hall effect sensor.

10. The apparatus of claim 8, wherein said bias current is chosen to be approximately equal to a typical operating bias current of said magnetoresistive element when said magnetoresistive element is functioning in a disk drive.

11. The apparatus of claim 8, wherein said electromagnet is a coil magnet.

12. The apparatus of claim 8, wherein said signal processor measures the rate of change of said resistive characteristics of said magnetoresistive element as a function of the magnetic field intensity applied to said magnetoresistive element.

13. The apparatus of claim 8, further comprising a controller capable of varying the amplitude of the time-varying voltage supplied to said electromagnet.

14. The apparatus of claim 8 wherein said filter comprises a capacitor.

15. A method for measuring the resistance of a magnetoresistive device as a function of the magnetic field applied thereto, said method comprising the steps of:
   applying a periodically-varying magnetic field to said magnetoresistive device, wherein said periodically-varying magnetic field includes multiple cycles of substantially equal time duration;
   providing a magnetic field output signal which is proportional to said periodically-varying magnetic field;
   passing an electrical current through said magnetoresistive device thereby producing a magnetoresistive device voltage signal across said magnetoresistive device which is characteristic of the resistance of said magnetoresistive device, wherein said magnetoresistive device voltage signal has a time-varying component produced by said periodically-varying magnetic field and a time-invariant component;
   providing a filter at a first terminal of said magnetoresistive device;
   providing said magnetoresistive device voltage signal which is proportional to the resistance of said magnetoresistive device at said filter;
   removing said time-invariant component of said magnetoresistive device voltage signal with said filter;
   acquiring a plural integral number, N, of measurements of said time-varying component of said magnetoresistive device voltage signal during one or more of said cycles of said periodically-varying magnetic field;

acquiring said plural integral number, N, of measurements of said magnetic field output signal during one or more of said cycles of said periodically-varying magnetic field, wherein for each integral number comprising said N measurements, said measurement of said time-varying component of said magnetoresistive device voltage signal and said measurement of said magnetic field output signal are acquired substantially simultaneously, thus providing N pairs of data wherein each pair of data includes a measurement of said time-varying component of said magnetoresistive device voltage signal and said magnetic field output signal which occurred at substantially the same time; and analyzing said pairs of data of said time-varying component of said magnetoresistive device voltage signal and said time-varying component of said magnetic field output signal which is proportional to said periodically-varying magnetic field to determine the resistance of said magnetoresistive device as a function of the magnetic field applied to said magnetoresistive device.

16. The method of claim 15 wherein said step of passing an electrical current through said magnetoresistive device further comprises the step of applying a constant DC bias current to said first terminal of said magnetoresistive device.

17. The method of claim 15, wherein said step of providing a magnetic field output signal which is proportional to said periodically-varying magnetic field further comprises providing a Hall effect sensor to measure said periodically-varying magnetic field.

18. The method of claim 15, wherein the step of providing a filter further comprises the step of providing a filtering capacitor.

19. An apparatus for determining the resistance of a magnetoresistive element in response to a time-varying magnetic field, comprising:

an electromagnet located adjacent said magnetoresistive element wherein a time-varying voltage is applied to said electromagnet, thereby generating a time-varying magnetic field having a time-varying magnetic field intensity;

a magnetic field intensity indicator which provides a magnetic field output signal, $V_B(t)$, which is proportional to said time-varying magnetic field intensity of said time-varying magnetic field at said magnetoresistive element;

a current source connected to said magnetoresistive element for passing an electrical current through said magnetoresistive element thereby producing a magnetoresistive element voltage signal across said magnetoresistive element which is characteristic of the resistance of said magnetoresistive element, wherein said magnetoresistive element voltage signal has a time-varying component, $V_r(t)$, produced by said time-varying magnetic field and a time-invariant component;

a filter connected to said magnetoresistive element, wherein said filter substantially blocks said time-invariant component of said magnetoresistive element voltage signal and transmits said time-varying component, $V_r(t)$, of said magnetoresistive element voltage signal;

a voltage sensor connected to said filter for detecting said time-varying component $V_r(t)$ of said magnetoresistive element voltage signal;

a signal sampler connected to said voltage sensor and said magnetic field intensity indicator, wherein said signal sampler acquires a plurality of real-time values of said magnetoresistive element voltage signal $V_r(t)$ including first and second real-time magnetoresistive element voltage signal values, $V_r(t_1)$ and $V_r(t_2)$ at first and second real-times $t_1$ and $t_2$, respectively, and a plurality of real-time values of said magnetic field output signal $V_B(t)$ including first and second real-time magnetic field output signal values, $V_B(t_1)$ and $V_B(t_2)$ at said first and second real-times $t_1$ and $t_2$, respectively; and a signal processor connected to said signal sampler wherein said signal processor receives and correlates said plurality of real-time values of said magnetoresistive element voltage signal $V_r(t)$ and said plurality of real-time values of said magnetic field output signal $V_B(t)$ as a function of time, including correlating said first real-time value of said magnetoresistive element voltage signal $V_r(t_1)$ with said first real-time value of said magnetic field output signal $V_B(t_1)$ and correlating said second real-time value of said magnetoresistive element voltage signal $V_r(t_2)$ with said second real-time value of said magnetic field output signal $V_B(t_2)$, thereby determining the resistance of said magnetoresistive element as a function of said time-varying magnetic field intensity.

20. The apparatus of claim 19 wherein said signal sampler further comprises:

a first analog-to-digital converter (ADC) connected to said magnetic field intensity indicator for acquiring said first and second time values of said magnetic field output signal $V_B(t_1)$ and $V_B(t_2)$; and a second analog-to-digital converter (ADC) connected to said voltage sensor for acquiring said first and second time values of said magnetoresistive element voltage signal $V_r(t_1)$ and $V_r(t_2)$.

21. The apparatus of claim 19 wherein said signal sampler further comprises a multiplexed analog-to-digital converter (ADC) having a first ADC input connected to said magnetic field intensity indicator for acquiring said first and second time values of said magnetic field output signal $V_B(t_1)$ and $V_B(t_2)$, and a second ADC input connected to said voltage sensor for acquiring said first and second time values of said magnetoresistive element voltage signal $V_r(t_1)$ and $V_r(t_2)$.

22. The apparatus of claim 19 wherein said time-varying voltage applied to said electromagnet is power line voltage.

23. The apparatus of claim 19 wherein said filter comprises a capacitor.

24. The apparatus of claim 19, wherein said magnetic field intensity indicator further comprises a Hall effect sensor.

25. An apparatus for rapidly determining the resistance of a magnetoresistive element at a plurality of different magnetic field values comprising:

an electromagnet located adjacent the magnetoresistive element wherein an alternating current (AC) having an AC frequency is applied to said electromagnet, thereby subjecting the magnetoresistive element to a periodic time-varying magnetic field;

a magnetic field intensity indicator which provides a magnetic field output signal, $V_B(t)$, which is proportional to said periodic time-varying magnetic field at the magnetoresistive element;

a current source connected to the magnetoresistive element for passing an electrical current through the magnetoresistive element thereby producing a magnetoresistive element voltage signal across the magnetoresistive element which is characteristic of the resistance of the magnetoresistive element, wherein said magnetoresistive element voltage signal has a periodic time-varying component, $V_r(t)$, produced by said periodic time-varying magnetic field and a time-invariant component;

a capacitor connected to the magnetoresistive element, wherein said capacitor substantially blocks said time-invariant component of said magnetoresistive element voltage signal and transmits said periodic time-varying component, $V_r(t)$, of said magnetoresistive element voltage signal;

a voltage sensor connected to said capacitor for detecting said periodic time-varying component $V_r(t)$ of said magnetoresistive element voltage signal;

a multiplexed analog-to-digital converter (ADC) which operates at an ADC frequency which is greater than said AC frequency, said ADC having a first ADC input connected to said magnetic field intensity indicator for acquiring n values of said magnetic field output signals $V_B(t_n)$, during each of a plurality of cycles of said AC frequency, and a second ADC input connected to said voltage sensor for acquiring n values of said magnetoresistive element voltage signals $V_r(t_n)$ during each of a plurality of cycles of said AC frequency; and a signal processor connected to said multiplexed analog-to-digital converter wherein said signal processor receives and correlates said n values of said magnetoresistive element voltage signals $V_r(t_n)$ and said n values of said magnetic field output signals $V_B(t_n)$ such that for each value of n, $V_r(t_n)$ corresponds to said magnetoresistive element voltage signal measured when the magnetic field at the magnetoresistive element is substantially equal to $V_B(t_n)$, thereby determining the resistance of the magnetoresistive element at a plurality of different values of said time-varying magnetic field intensity.

26. The apparatus of claim 25 wherein said alternating current (AC) applied to said electromagnet is from an AC power line.

27. The apparatus of claim 25, wherein said magnetic field intensity indicator further comprises a Hall effect sensor.

* * * * *